United States Patent
Magri' et al.

(10) Patent No.: US 7,067,363 B2
(45) Date of Patent: Jun. 27, 2006

(54) VERTICAL-CONDUCTION AND PLANAR-STRUCTURE MOS DEVICE WITH A DOUBLE THICKNESS OF GATE OXIDE AND METHOD FOR REALIZING POWER VERTICAL MOS TRANSISTORS WITH IMPROVED STATIC AND DYNAMIC PERFORMANCES AND HIGH SCALING DOWN DENSITY

(75) Inventors: Angelo Magri', Belpasso (IT); Ferruccio Frisina, Sant' Agata Li Battiati (IT); Giuseppe Ferla, Catania (IT); Marco Camalleri, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/749,134

(22) Filed: Dec. 30, 2003

(65) Prior Publication Data

US 2005/0139906 A1    Jun. 30, 2005

(30) Foreign Application Priority Data

Dec. 30, 2002   (EP) .................................. 02425803

(51) Int. Cl.
  *H01L 21/337*  (2006.01)
  *H01L 29/80*   (2006.01)
  *H01L 31/112*  (2006.01)

(52) U.S. Cl. ...................... 438/194; 438/192; 257/263; 257/285

(58) Field of Classification Search ................ 257/327, 257/333, 263, 285, 256, 329, 335, 33; 438/156, 438/141, 186, 192, 194, 196, 268, 289, 778, 438/212
See application file for complete search history.

(56) References Cited

U.S. PATENT DOCUMENTS

| | | | |
|---|---|---|---|
| 4,376,286 A | | 3/1983 | Lidow et al. .................. 357/23 |
| 4,974,059 A | | 11/1990 | Kinzer ...................... 357/23.4 |
| 5,291,050 A | * | 3/1994 | Nishimura ................... 257/340 |
| 5,856,696 A | * | 1/1999 | Blanchard .................... 257/377 |
| 6,040,598 A | * | 3/2000 | Nakayama et al. ......... 257/329 |
| 6,225,669 B1 | * | 5/2001 | Long et al. ................. 257/401 |
| 2003/0057478 A1 | * | 3/2003 | Yun et al. .................... 257/328 |
| 2005/0121720 A1 | * | 6/2005 | Sin et al. ..................... 257/341 |

FOREIGN PATENT DOCUMENTS

| | | | | |
|---|---|---|---|---|
| EP | 0119400 | | 9/1984 | |
| EP | 0586835 | | 3/1994 | |
| EP | 0747968 | | 12/1996 | |
| JP | 01005070 | * | 1/1989 | .................... 29/78 |

* cited by examiner

*Primary Examiner*—Nathan J. Flynn
*Assistant Examiner*—Victor A. Mandala, Jr.
(74) *Attorney, Agent, or Firm*—Lisa K. Jorgenson; Allen, Dyer, Doppelt, Milbrath & Gilchrist, P.A.

(57) ABSTRACT

A vertical-conduction and planar-structure MOS device having a double thickness gate oxide includes a semiconductor substrate including spaced apart active areas in the semiconductor substrate and defining a JFET area therebetween. The JFET area also forms a channel between the spaced apart active areas. A gate oxide is on the semiconductor substrate and includes a first portion having a first thickness on the active areas and at a periphery of the JFET area, and a second portion having a second thickness on a central area of the JFET area. The second thickness is greater than the first thickness. The JFET area also includes an enrichment region under the second portion of the gate oxide.

13 Claims, 8 Drawing Sheets

VERTICAL-CONDUCTION AND PLANAR-STRUCTURE MOS DEVICE WITH A DOUBLE THICKNESS OF GATE OXIDE AND METHOD FOR REALIZING POWER VERTICAL MOS TRANSISTORS WITH IMPROVED STATIC AND DYNAMIC PERFORMANCES AND HIGH SCALING DOWN DENSITY

FIELD OF THE INVENTION

The present invention relates in general to vertical-conduction MOS power devices and to a method for forming the same on a commercial scale and with a high integration density. More specifically, the present invention relates to a vertical-conduction and a planar-structure MOS device with a double thickness gate oxide.

The present invention also relates to a process for forming vertical-conduction MOS power devices starting from corresponding planar MOS structures. Even more specifically, the present invention relates to a method for reducing the capacitance of MOS devices of the type concerned, and operating simultaneously and in a self-aligned way on corresponding planar MOS structures.

BACKGROUND OF THE INVENTION

In a VDMOS device (FIG. 1) the resistive component due to the JFET area that is created between body wells limits an increase in the packing density, and thus an improvement in the static and dynamic performances of the device. The JFET resistance depends not only on the epitaxial layer resistivity, but also on the distance between the two adjacent body wells. The capacitances associated with the gate oxide, and thus the charge storage capacity of the gate region depend, in an opposite sense, on this distance.

Improving the output resistance by increasing the distance between the body wells means penalizing the dynamic features of the device. This problem occurred up to now mainly in high voltage MOS devices (~500V) because of the high epitaxial layer resistivity (~20 Ω/cm), while in low voltage devices (30–60V) the problem is considered almost negligible because of the low epitaxial layer resistivity (<1 Ω/cm).

As far as PMOS devices are concerned, particularly low voltage PMOS devices, higher and higher integration densities (i.e., scaling down) and the formation of submicron channel lengths, although obtained with other known technologies, led to a considerable reduction of the output resistance components. This is due to the channel and to a greater focus on the component due to the JFET and to the need to reduce capacitances.

By way of example of this trend, the following TABLE 1 shows a comparison between the relative weight of the output resistance components of a 30-volt P-channel device.

TABLE 1

| Output resistance components for a 30-volt P-channel PMOS device | Relative weight |
| --- | --- |
| Die-package connection | 25% |
| Substrate contribution | 12% |
| Epi layer contribution | 12% |
| Contribution of the JFET between body wells | 33% |

TABLE 1-continued

| Output resistance components for a 30-volt P-channel PMOS device | Relative weight |
| --- | --- |
| Component due to the channel | 18% |
| Ron | 100% |

To preserve the dynamic features of a PMOS device, and improve in parallel the output resistance thereof, methods based on the reduction of the distance between body wells have been implemented. These prior art methods essentially provide either the surface resistivity modification (FIG. 2) or the following technology change: a) surface enrichment between body wells to locally reduce resistivity (U.S. Pat. Nos. 4,376,286 and 4,974,059); b) use of a low-resistivity surface epitaxial layer; and c) use of trench technology.

The methods a) and b) applied to low voltage PMOS devices involve known technical drawbacks linked to the influence of the enriched layer on the channel. In fact, in a low voltage PMOS structure the drain is characterized by an epitaxial layer whose concentration ranges between 1 and $5*10^{16}$ at/cm$^3$, and gate oxides, because of the low threshold voltage (driving with Vg<4.5V) and the low capacitances required by the applications, have a thickness not lower than 200 Å and peak concentrations in the channel do not exceed $10^{17}$ at/cm$^3$.

This means that the highest concentration in the channel is higher by almost an order of magnitude than the epitaxial layer concentration (FIG. 3). Consequently, as soon as attempts are made to enrich uniformly the whole surface, channel features (e.g., threshold voltage and channel length) are significantly changed which jeopardizes function of the PMOS device. This phenomenon is known as premature punch through.

With the third mentioned method, point (c), the JFET component can be eliminated. However, the capacitance problem is not solved since in most cases the area whereon the gate oxide rests is increased, as shown by the comparison between the two gate structures represented in FIG. 4. In the case of a planar structure VDMOS the gate area is proportional to the distance L (1.5–4 μm), while in the case of a trench technology device it is proportional to the sum of the double depth and of the trench width (2h+1~2.5–4 μm).

SUMMARY OF THE INVENTION

An object of the present invention is to provide a method for forming vertical-conduction MOS power devices having improved static and dynamic performances with respect to prior art devices, as well as being capable of reducing the capacitances of these devices for the same static performances.

This and other objects, advantages and features in accordance with the present invention are provided by using a double thickness gate oxide comprising a thin layer in the channel region and a thicker layer on inactive areas. This provides an enrichment of the JFET region to reduce the distance between the body regions and to increase the integration area, which reduces the extension of the gate oxide surface.

More particularly, the method for forming vertical MOS devices of the type concerned comprises the steps of forming on a planar MOS structure a double thickness for the gate oxide comprising a thin layer in the channel region of the structure and a thicker layer in the inactive areas thereof.

The method may further comprise and enriching, simultaneously and in a self-aligned way, the JFET area to reduce the distance between two adjacent body wells. This reduces the gate oxide surface and allows for an increased packing density.

BRIEF DESCRIPTION OF THE DRAWINGS

The features and advantages of the method according to the present invention will be apparent from the following description of an embodiment thereof given by way of non-limiting examples with reference to the attached drawings.

DETAILED DESCRIPTION OF THE PREFERRED EMBODIMENTS

Figure 1:
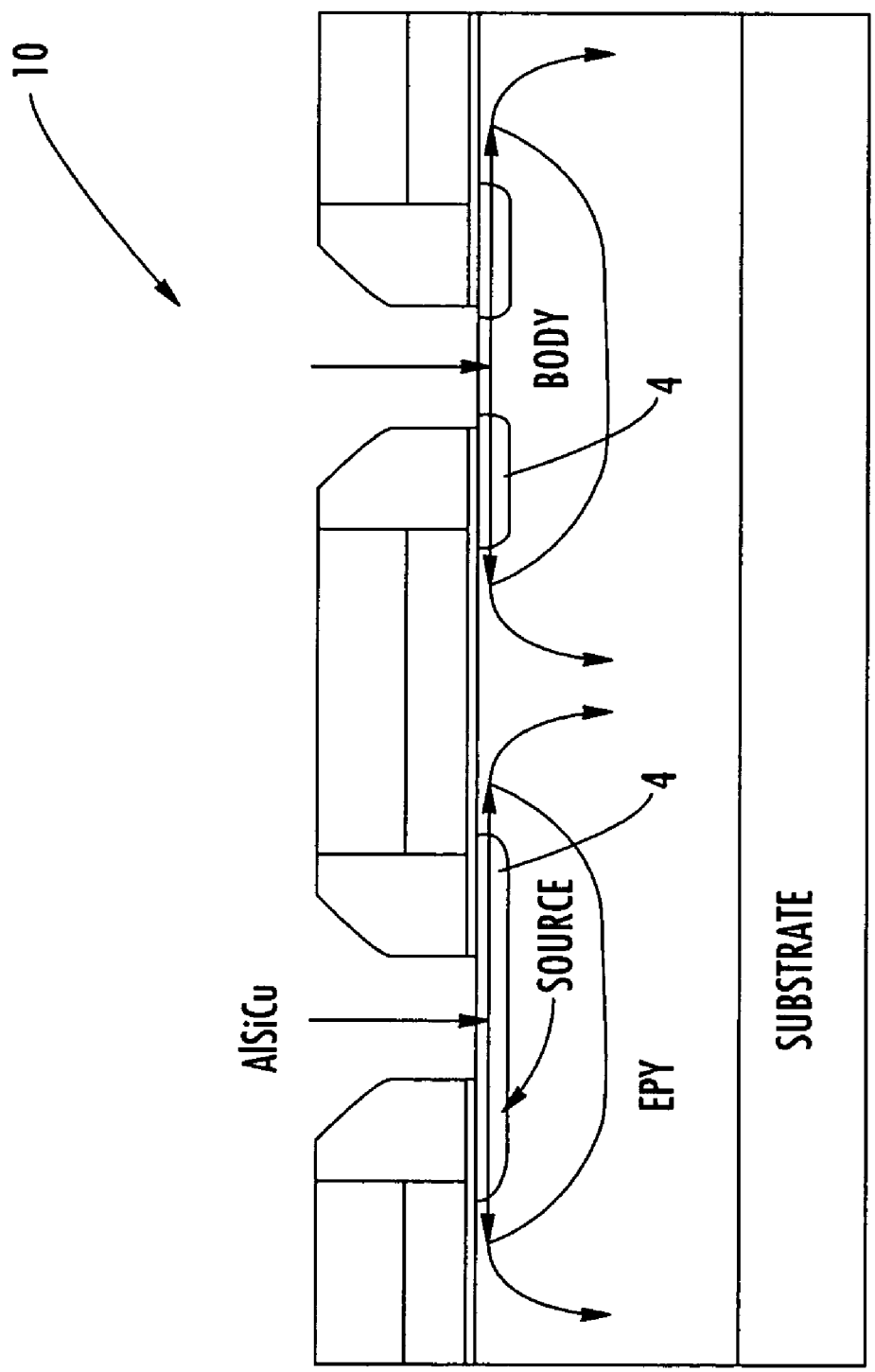
FIG. 1 is a vertical-section and enlarged schematic view of a prior art PMOS electronic device with the current flow direction during operation being highlighted.
Figure 2:
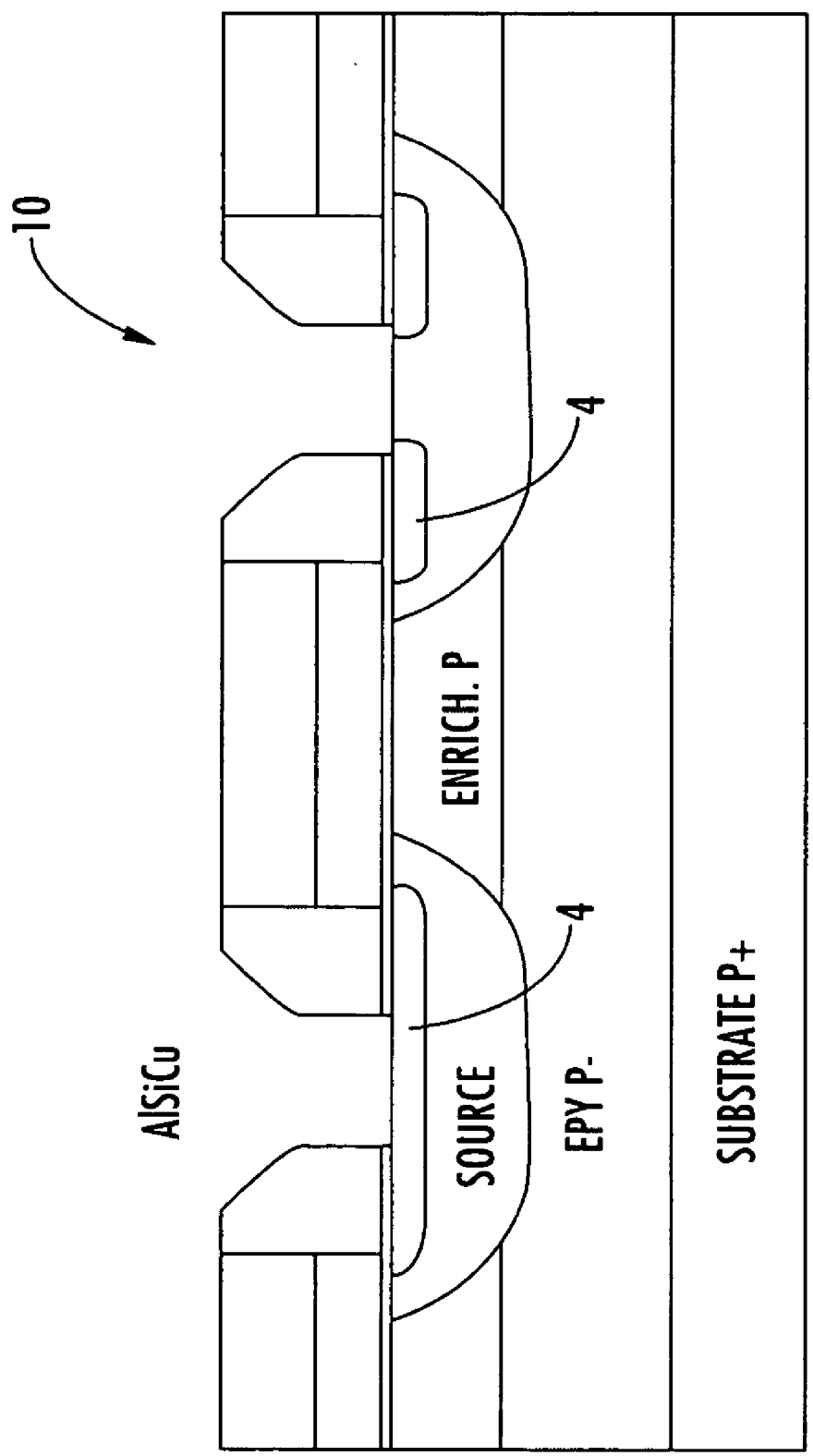
FIG. 2 is a vertical-section and enlarged schematic view of a prior art surface-enriched PMOS electronic device.
Figure 3:
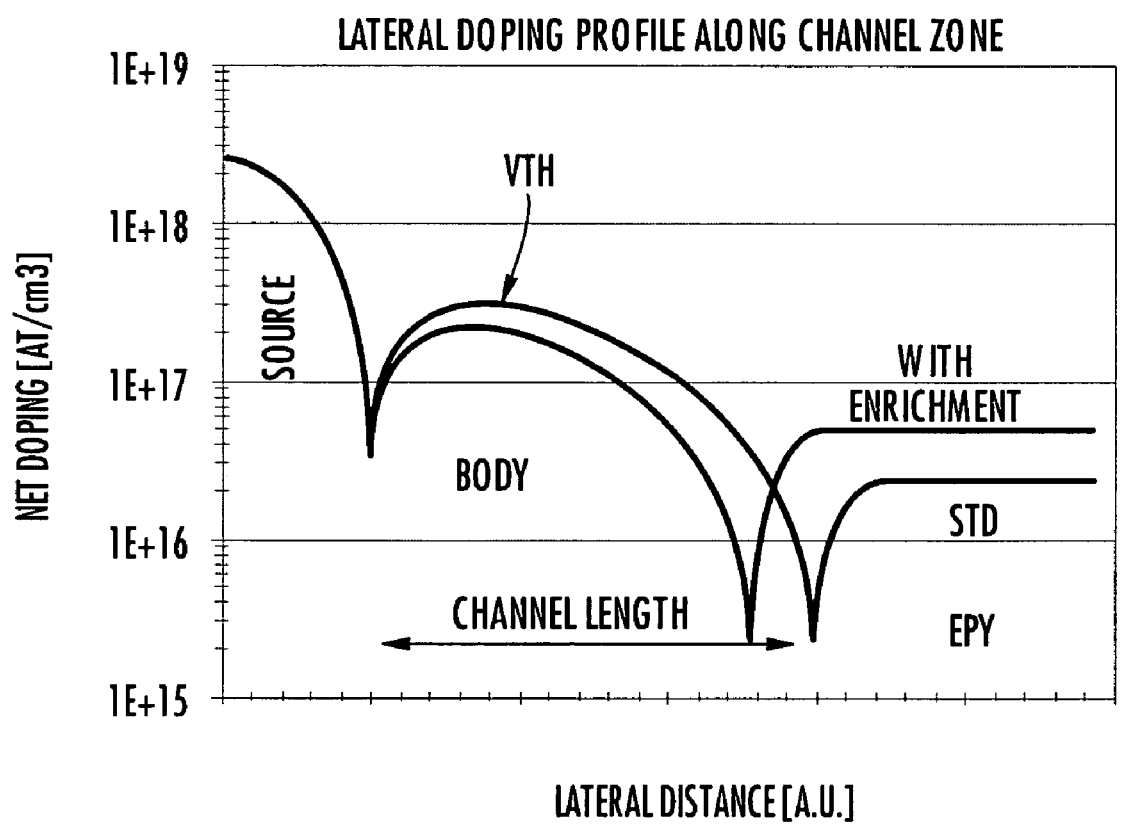
FIG. 3 is a diagram showing concentration vs. channel width between the PMOS devices of FIGS. 1 and 2, and in particular, showing the surface enrichment influence on the concentration profile along the channel.
Figure 4:
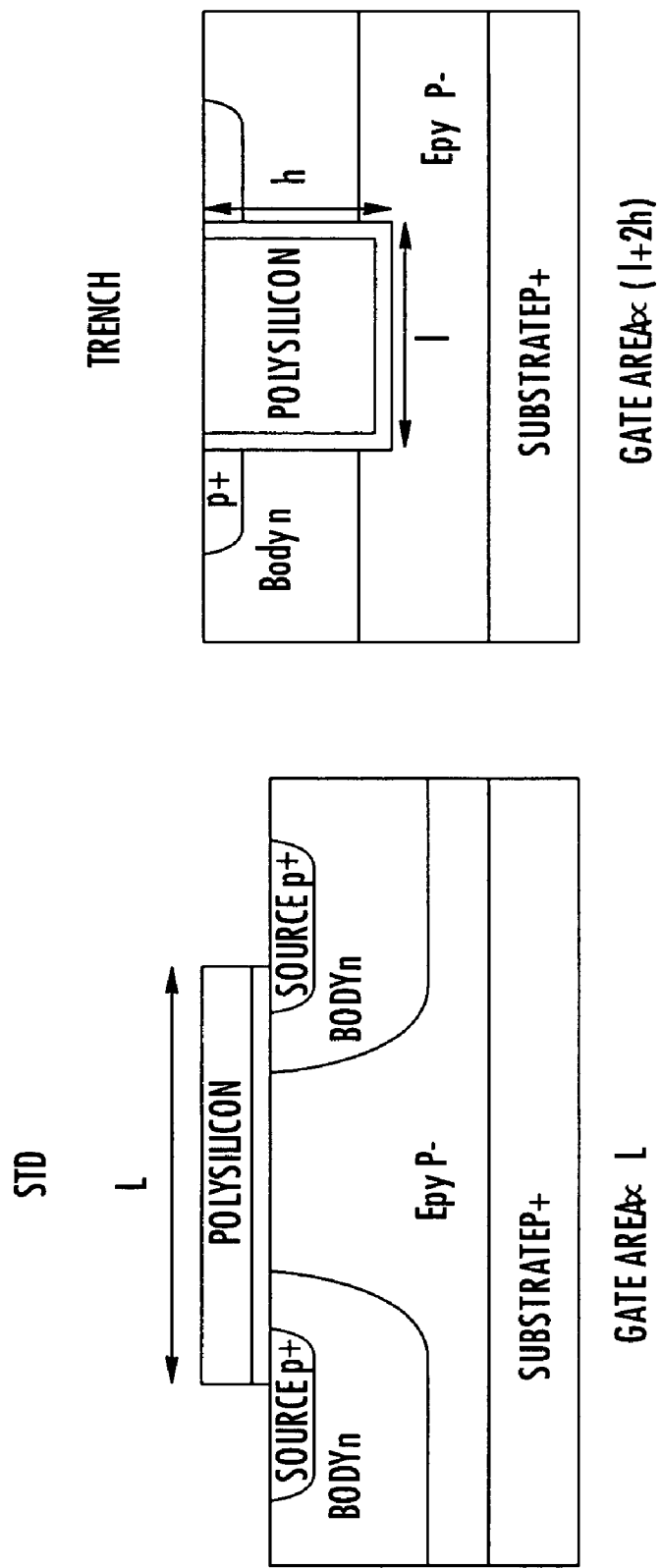
FIG. 4 is a schematic diagram comparing the planar structure with the trench structure in an intermediate step, both formed according to the prior art, for illustrating the typical magnitudes on which the surface covered by the gate oxide depends.
Figure 5:
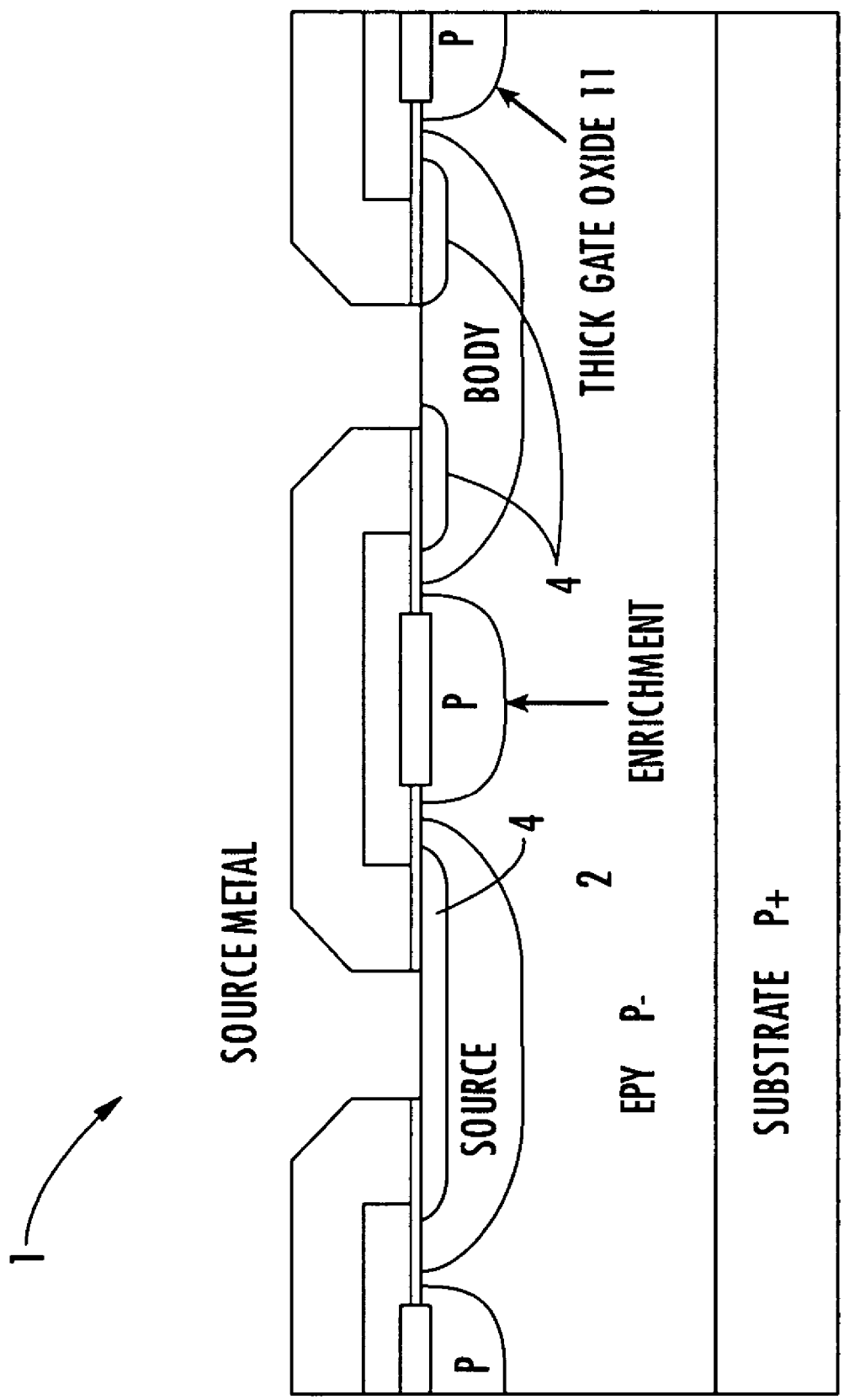
FIG. 5 is a vertical-section and enlarged schematic view of a vertical MOS electronic device underlining the specific features introduced by the present invention, e.g., oxide thickening and a corresponding enrichment of the epitaxial layer between body wells.

With reference to the figures, and particularly to the examples of FIG. 5, a MOS transistor electronic device, particularly of the PMOS type and according to the method of the present invention, is schematically indicated. The process steps and the structures described below do not form a complete process flow for manufacturing integrated circuits. In fact, the present invention can be implemented together with the integrated circuit manufacturing techniques presently used in this field, but only those commonly used process steps necessary to understand the invention are described.

The figures representing cross sections of portions of an integrated circuit during the manufacturing are not drawn to scale. Instead, they are drawn to show the important features of the invention.

The transistor device 1 is obtained from a semiconductor substrate 2 covered by an oxide protective layer. According to a preferred embodiment, described with reference to FIGS. 6a to 6c, the method of the present invention is characterized in that it comprises the following steps.

The active areas 4 of the transistor 1 and a channel region between them are defined, in a conventional way, by opening the oxide protective layer on the substrate 2. A pad oxide 5 is grown on the active areas 4 and on the channel at a thickness of about 100–500 A. A gate region according to the method of the invention will be formed on the channel. A nitride layer 6 is deposited on the oxide layer 5. The thickness of this nitride layer 6 can reach 300–900 A. A photomasking step is now provided to define the inactive areas 11 which are to have a thicker oxide layer. This step is implemented by a photoresist layer 7. An etching step is performed to remove the nitride layer 6 on the channel to expose the oxide layer 5, as shown in FIG. 6a.

A further implant step allows an enrichment of a central area of the channel 9 underlying the area 11 to be formed with P or As ions for an N-channel transistor, and with B or Al ions for a P-channel transistor. The implant energy can be regulated between 60–500 KeV while ion doses can range from 1E12 and 1E13 ions/cm$^2$. The resist layer 7 is then removed. The following step provides the growth of a first gate oxide layer 8 of variable thickness between 800 and 3000 A. This step can provide a possible dopant "drive in", as shown in FIG. 6b. A wet etching of the nitride layer 6 is performed with $H_3PO_4$ acid, or some other convenient method is performed.

A selective wet etching with HF acid allows the oxide layer 5 on the active areas 4 to also be removed. The etching time is such to remove the whole pad oxide layer 5, but without removing the first gate oxide layer 8. The greater the difference between the two oxide thicknesses results in the margins of the etching times being the widest.

A sacrificial oxide layer of about 100–600 A is then formed. This sacrificial oxide layer is immediately wet-etched with an HF acid to expose the gate region of the transistor 1 on the channel but at the periphery of the area 11. In this case too, the etching time is such to remove the whole sacrificial oxide but without removing the first gate oxide layer 8. The greater the difference between the two oxide thicknesses results in the margins of the etching times being the widest.

The method continues with the growth of a second gate oxide layer having a variable thickness ranging from 100 to 1000 A. A conductive layer 12, for example, polycrystalline silicon (i.e., poly) is deposited on the gate region, which is doped to change the conductivity.

Figure 6C:
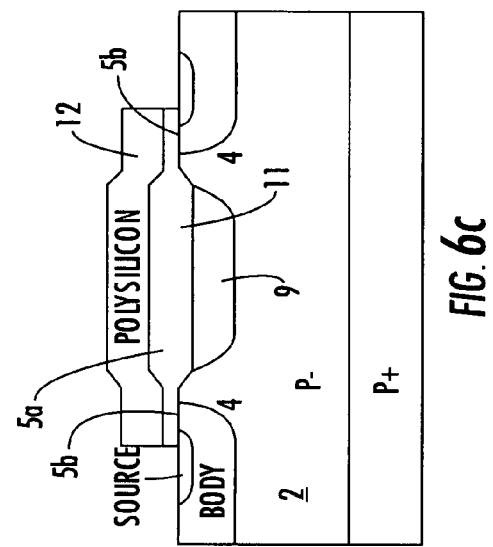
FIGS. 6a, 6b and 6c are vertical-section and enlarged schematic views of the PMOS device according to a first method of the invention illustrating different steps of the manufacturing method.
Figure 6A:
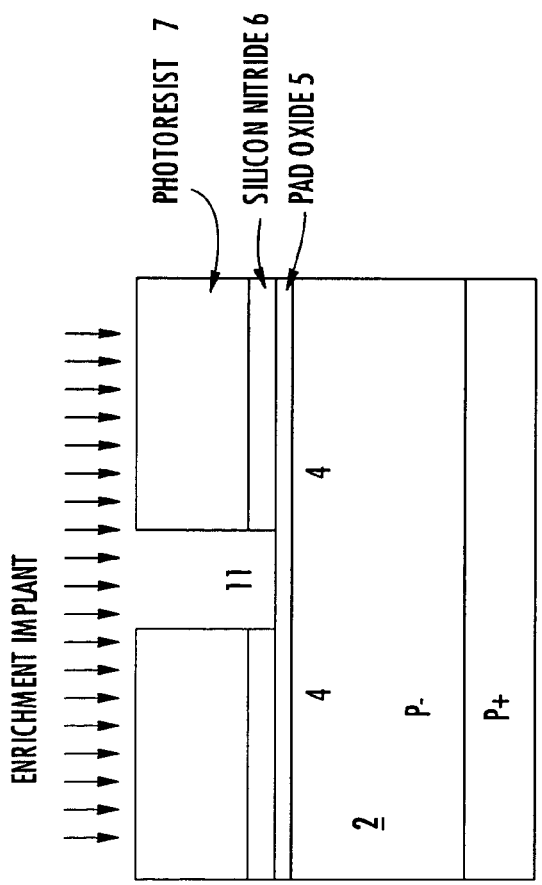
Figure 6B:
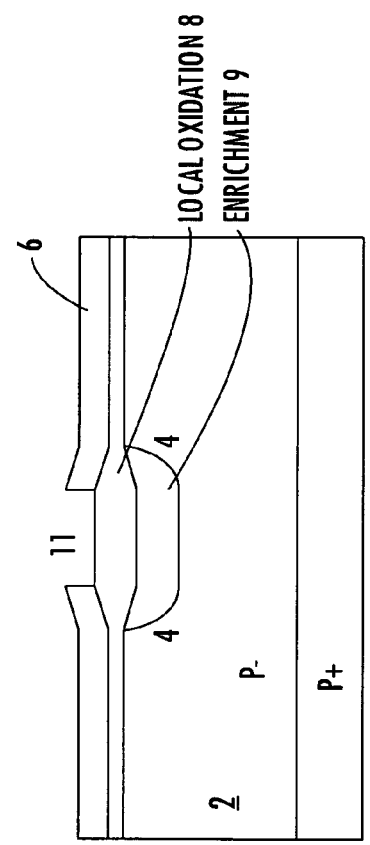

The obtained MOS transistor structure can be completed with further process steps continuing according to the prior art and leading to define traditional body and source wells housing the transistor active areas 4, as shown in FIG. 6c. These body wells can advantageously be formed in accordance with the present invention with a reduced mutual distance.

In accordance with a second preferred embodiment, described with reference to FIGS. 7a to 7c, the method of the present invention is characterized in that it comprises the following operative steps.

The active areas 4 of the transistor 1 and a channel region between them are defined in a conventional way by opening the oxide protective layer on the substrate 2. The oxide layer 5 is grown on the active areas 4 and on the channel for the thickness required for the device to correctly operate (100–1500 A).

A polysilicon layer 13 having a thickness lower or equal to half the thickness of a portion of the thicker oxide layer 5a is deposited. A nitride layer 6 of 300–900 A is deposited on the polysilicon layer 13. The inactive areas 11, which have a thicker oxide layer, are defined using photomasking.

Figure 7C:
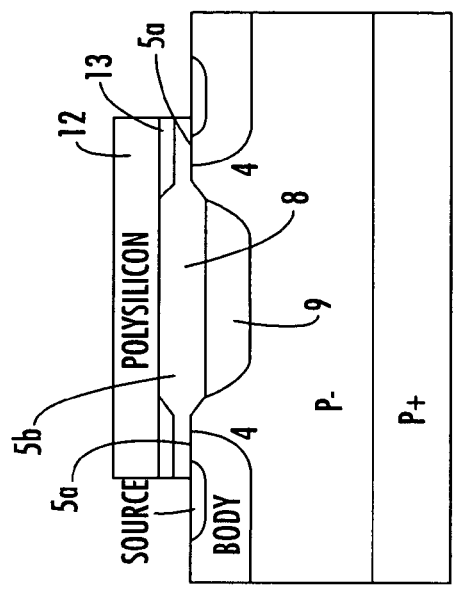
FIGS. 7a, 7b and 7c are vertical-section and enlarged schematic views of the PMOS device according to a second method of the invention illustrating different steps of the manufacturing method.
Figure 7A:
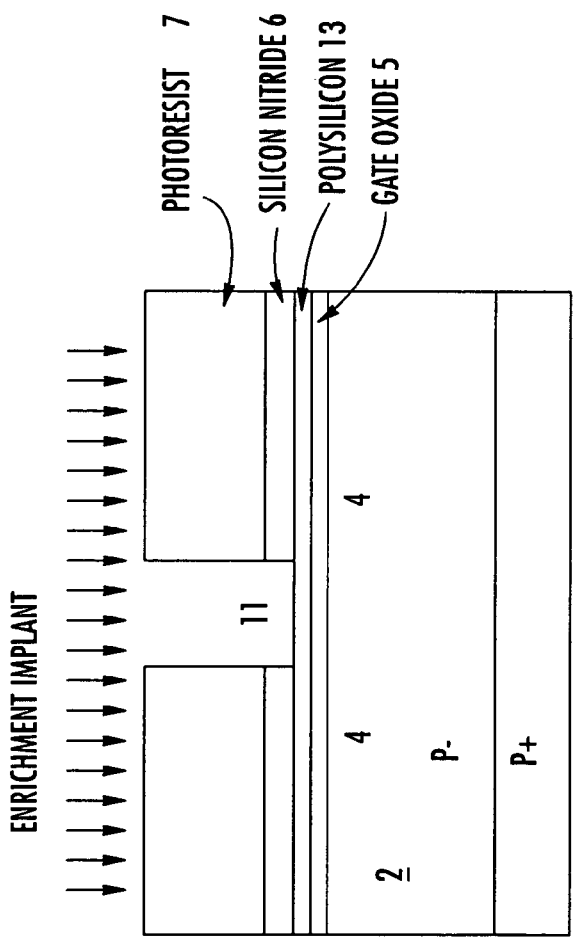

The nitride layer 6 is etched to remove the same on the channel, as shown in FIG. 7a, to expose the polysilicon layer 13.

Further implanting is performed to form the enrichment region 9 in the channel central area underlying the area 11 using the photoresist as an implant window. The implant can be performed with P or As ions for an N-channel transistor, and with B or Al ions for a P-channel transistor. The implant energy can be regulated between 60–500 KeV while ion doses can range from 1E12 and 1E13 ions/cm$^2$.

Figure 7B:
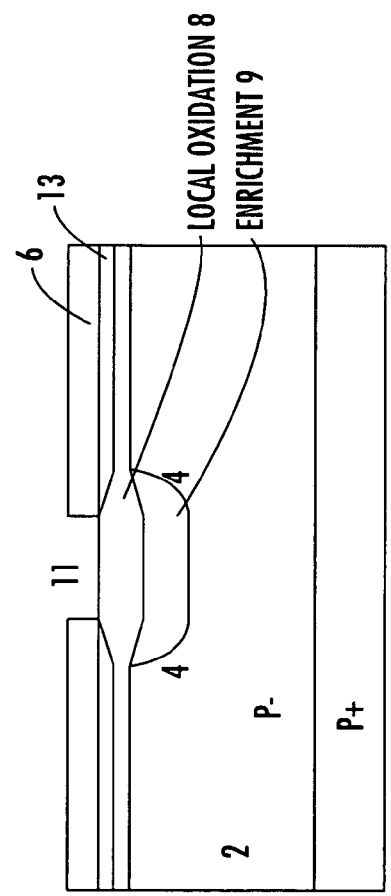

The photoresist is removed and the polysilicon not covered by the nitride layer 6 is completely oxidized, as shown in FIG. 7b. The nitride layer 6 is then etched. A conductive layer 12 is deposited to form the gate electrode. For example, polycrystalline silicon, i.e., poly, which is doped to change conductivity is deposited.

The obtained MOS transistor structure can be completed with further process steps continuing according to the prior art, while defining traditional body and source wells housing the transistor active areas 4, as shown in FIG. 7c. These body wells can advantageously be formed in accordance with the present invention with a reduced mutual distance. It is also possible to advantageously use a metal layer (for example, Ti, W or Co) as a conductive layer 12 to form the gate electrode.

The previous detailed descriptions show how the transistor obtained with the method according to the invention is a planar MOS device with a double thickness gate oxide, i.e., with a thinner oxide layer in the channel area and a thicker oxide layer in the central channel inactive area. In particular, the final MOS device comprises a gate oxide layer having thin oxide side portions 5a and a thick oxide central portion 5b. This thick oxide central portion 5b is in correspondence with the channel central inactive area.

According to the alternative embodiment of the method according to the invention, the final MOS device comprises a polysilicon layer 13 on the side portions 5a of the gate oxide layer. The enrichment region 9 in the JFET area underlying and self-aligned with the thicker oxide central portion 5a allows the distance between two adjacent body wells, and thus the gate oxide surface to be reduced. This allows an increased integration or packing density of the transistors to be obtained.

Figure 8:
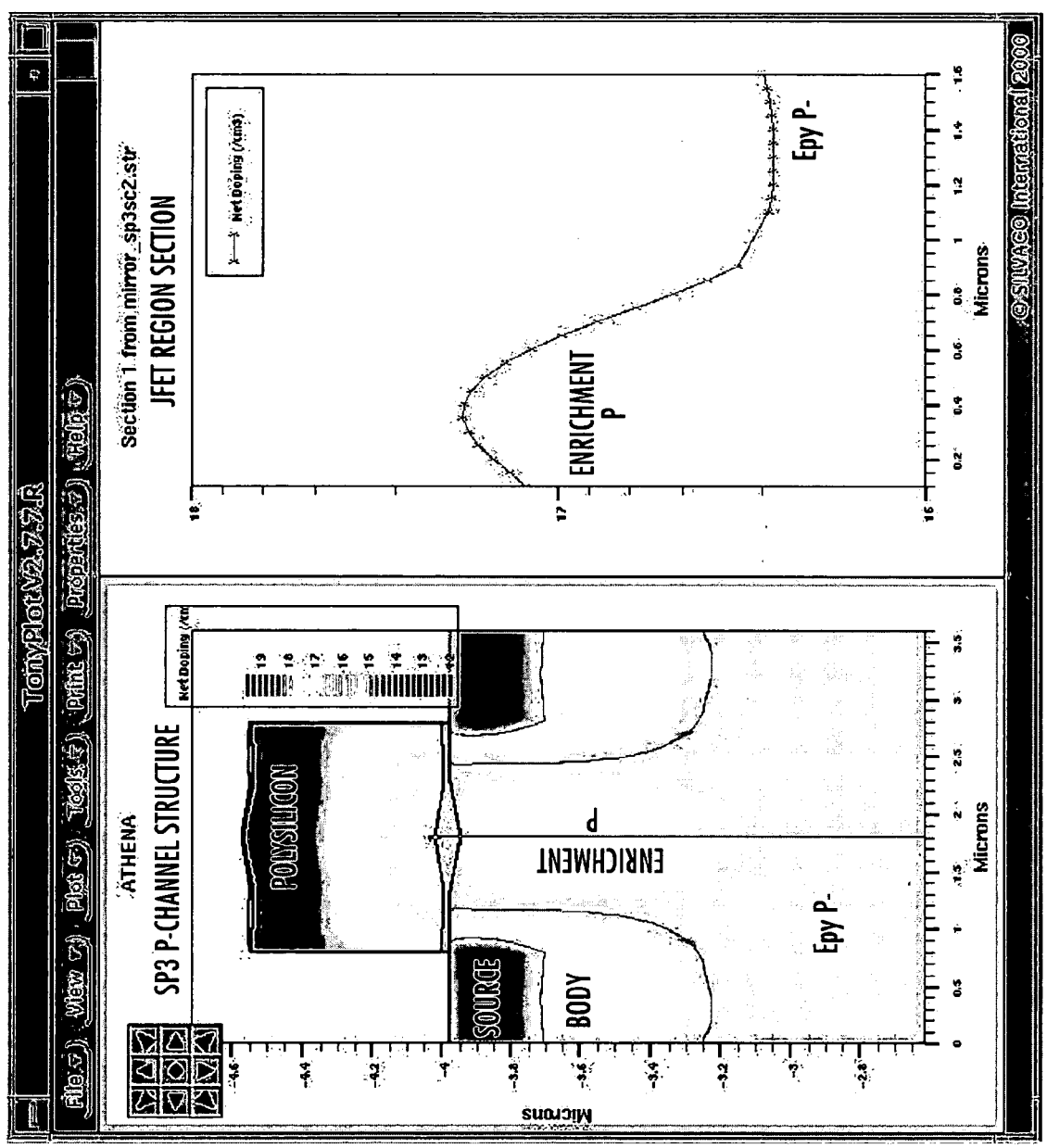
FIG. 8 is a diagram illustrating the vertical section of a transistor at an intermediate step according to the invention obtained by simulations.

FIGS. 8 shows the vertical section of a transistor formed according to the invention. This section has been obtained by process simulations for illustrating the gate oxide thickening and the enrichment layer position. FIG. 8 also shows the concentration profile along the central line between two body wells.

The invention claimed is:

1. A method for forming a semiconductor device comprising:
   forming spaced apart active areas in a semiconductor substrate and defining a JFET area therebetween, the JFET area also forming a channel between the spaced apart active areas; and
   forming a gate oxide on the semiconductor substrate and comprising a first portion having a first thickness on the active areas and at a periphery of the JFET area, and a second portion having a second thickness on a central area of the JFET area, the second thickness being greater than the first thickness, wherein forming the gate oxide comprises
      forming an oxide pad on the active areas and on the channel,
      forming a nitride layer on the oxide pad,
      forming a photoresist layer on the nitride layer except over a portion of the JFET area corresponding to the second portion of the gate oxide,
      removing the exposed nitride layer,
      implanting dopants through the exposed oxide pad while using the photoresist as an implant window for forming an enrichment region in the JFET area under the second portion of the gate oxide, and
      removing the photoresist layer.

2. A method according to claim 1, wherein the enrichment region is self-aligned with the second portion of the gate oxide.

3. A method according to claim 1, wherein an interface between the first and second portions of the gate oxide has a tapered thickness.

4. A method according to claim 1, wherein forming the gate oxide comprises:
   growing the oxide pad for forming the first portion of the gate oxide layer;
   removing the nitride layer;
   selectively removing the first portion off the gate oxide layer on a central area of the active areas;
   forming a sacrificial oxide layer on the first portion of the gate oxide layer;
   removing the sacrificial oxide layer to expose a gate region on the channel; and
   growing the first portion of the gate oxide layer on the gate region for forming the second portion of the gate oxide.

5. A method according to claim 1, wherein the oxide pad has a thickness within a range of about 100 to 500 A; and wherein the nitride layer has a thickness with a range of about 300 to 900 A.

6. A method according to claim 1, wherein the dopants comprise at least one of P, As and Sb ions for an N-channel transistor, and with the implanting being performed at an implant energy within a range of 60 to 900 KeV with ion doses ranging between 1E12 to 1E13 ions/cm$^2$.

7. A method according to claim 1, wherein the dopants comprise at least one of B and Al ions for a P-channel transistor, and with the implanting being performed at an implant energy within a range of 60 to 900 KeV with ion doses ranging between 1E12 to 1E13 ions/cm$^2$ .

8. A method for forming a semiconductor device comprising:
   forming spaced apart active areas in a semiconductor substrate and defining a JFET area therebetween, the JFET area also forming a channel between the source and drain areas;
   forming a gate oxide on the semiconductor substrate and comprising a first portion having a first thickness on the active areas and at a periphery of the JFET area, and a second portion having a second thickness on a central area of the JFET area, the second thickness being greater than the first thickness, wherein forming the gate oxide comprises
      forming an oxide pad on the active areas and on the channel,
      forming a polysilicon layer having a thickness less than or equal to one-half the second thickness of the second portion of the gate oxide,
      forming a nitride layer on the polysilicon layer,
      forming a photoresist layer on the nitride layer except over a portion of the JFET area corresponding to the second portion of the gate oxide, removing the exposed nitride layer,
implanting dopants through the exposed polysilicon layer while using the photoresist layer as an implant window for forming the enrichment region in the JFET area,
removing the photoresist layer,
oxidizing the polysilicon layer not covered by the nitride layer, and
removing the nitride layer; and
forming a gate electrode on the first and second portions of the gate oxide.

9. A method according to claim 8, wherein the enrichment region is self-aligned with the second portion of the gate oxide.

10. A method according to claim 8, wherein an interface between the first and second portions of the gate oxide has a tapered thickness.

11. A method according to claim 8, wherein the oxide pad has a thickness within a range of about 100 to 1500 A; and wherein the nitride layer has a thickness with a range of about 300 to 900 A.

12. A method according to claim 8, wherein the dopants comprise at least one of P, As and Sb ions for an N-channel transistor, and with the implanting being performed at an implant energy within a range of 60 to 900 KeV with ion doses ranging between 1E12 to 1E13 ions/an$^2$.

13. A method according to claim 8, wherein the dopants comprise at least one of B and Al ions for a P-channel transistor, and with the implanting being performed at an implant energy within a range of 60 to 900 KeV with ion doses ranging between 1E12 to 1E13 ions/cm$^2$.

* * * * *

UNITED STATES PATENT AND TRADEMARK OFFICE
CERTIFICATE OF CORRECTION

PATENT NO. : 7,067,363 B2
APPLICATION NO. : 10/749134
DATED : June 27, 2006
INVENTOR(S) : Magrí et al.

It is certified that error appears in the above-identified patent and that said Letters Patent is hereby corrected as shown below:

Column 5, Line 44    Delete: "FIGS. 8"
                     Insert -- FIG. 8 --

Column 8, Line 9     Delete: "ions/an$^2$"
                     Insert -- ions/cm$^2$ --

Signed and Sealed this

Seventh Day of August, 2007

JON W. DUDAS
*Director of the United States Patent and Trademark Office*